United States Patent
Ota et al.

(10) Patent No.: US 11,133,431 B2
(45) Date of Patent: Sep. 28, 2021

(54) LIGHT EMITTING DIODE WITH ION IMPLANTED RESISTIVE AREA, MANUFACTURING METHOD OF LIGHT EMITTING DIODE WITH ION IMPLANTED RESISTIVE AREA AND DISPLAY DEVICE INCLUDING LIGHT EMITTING DIODE WITH ION IMPLANTED RESISTIVE AREA

(71) Applicant: SAMSUNG ELECTRONICS CO., LTD., Suwon-si (KR)

(72) Inventors: Jitsuo Ota, Suwon-si (KR); Jihoon Kang, Suwon-si (KR); Sungtae Kim, Suwon-si (KR); Shunsuke Kimura, Suwon-si (KR); Yongdok Cha, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/684,720

(22) Filed: Nov. 15, 2019

(65) Prior Publication Data

US 2020/0161499 A1    May 21, 2020

(30) Foreign Application Priority Data

Nov. 16, 2018    (KR) .......... 10-2018-0141291

(51) Int. Cl.
*H01L 33/00*    (2010.01)
*H01L 31/12*    (2006.01)
(Continued)

(52) U.S. Cl.
CPC ...... *H01L 33/0095* (2013.01); *H01L 25/0753* (2013.01); *H01L 33/10* (2013.01); *H01L 33/62* (2013.01); *H01L 2933/0066* (2013.01)

(58) Field of Classification Search
CPC ..... H01L 33/0095; H01L 33/10; H01L 33/62; H01L 25/0753; H01L 2933/0066; H01L 33/486; H01L 33/60
See application file for complete search history.

(56) References Cited

U.S. PATENT DOCUMENTS 5,434,434 A    7/1995    Kasahara et al.
5,822,351 A *  10/1998    Kang ............... H01S 5/0264
                                                372/50.1
(Continued)

FOREIGN PATENT DOCUMENTS

JP    05-257173 A    10/1993
KR    1020130080301 A    7/2013

OTHER PUBLICATIONS

International Search Report (PCT/ISA/210) dated Feb. 21, 2020 from the International Searching Authority in counterpart application No. PCT/KR2019/015515.

(Continued)

*Primary Examiner* — Ismail A Muse
(74) *Attorney, Agent, or Firm* — Sughrue Mion, PLLC

(57) ABSTRACT

An LED, a manufacturing method thereof, and a display device including an LED are provided. Specifically, the disclosure relates to a flip-chip LED with high efficiency including a current confinement structure and a manufacturing method thereof, and a display device including such an LED. In particular, a flip-chip LED according to the disclosure includes a resistive area that surrounds a light-emitting layer and restricts current flow from the light emitting layer to the sidewalls.

15 Claims, 11 Drawing Sheets

(51) Int. Cl.
*H01L 29/26* (2006.01)
*H01L 27/15* (2006.01)
*H01L 33/10* (2010.01)
*H01L 33/62* (2010.01)
*H01L 25/075* (2006.01)

(56) References Cited

U.S. PATENT DOCUMENTS

| | | | |
|---|---|---|---|
| 9,450,147 | B2 | 9/2016 | McGroddy et al. |
| 2002/0123164 | A1* | 9/2002 | Slater, Jr. ............... H01L 33/405 438/39 |
| 2002/0134987 | A1* | 9/2002 | Takaoka ............... G02B 6/4202 257/98 |
| 2003/0052326 | A1* | 3/2003 | Ueda ...................... B82Y 20/00 257/101 |
| 2003/0180980 | A1 | 9/2003 | Margalith et al. |
| 2004/0046180 | A1* | 3/2004 | Takaoka ............... G02B 6/4202 257/98 |
| 2004/0191938 | A1* | 9/2004 | Ueda ...................... B82Y 20/00 438/21 |
| 2005/0258434 | A1* | 11/2005 | Abe ....................... B82Y 20/00 257/79 |
| 2006/0166391 | A1* | 7/2006 | Nemoto ................. B82Y 20/00 438/35 |
| 2007/0217458 | A1* | 9/2007 | Kitano ................ H01S 5/34333 372/43.01 |
| 2009/0309124 | A1* | 12/2009 | Wu ....................... H01L 33/305 257/99 |
| 2010/0051977 | A1* | 3/2010 | Kim ..................... H01L 27/153 257/93 |
| 2010/0151612 | A1* | 6/2010 | Ando .................... H01L 33/025 438/46 |
| 2011/0284822 | A1* | 11/2011 | Jung ....................... H01L 33/56 257/13 |
| 2011/0297914 | A1 | 12/2011 | Zheng et al. |
| 2015/0255674 | A1* | 9/2015 | Hirotani ................ H01L 33/405 257/98 |
| 2016/0179453 | A1* | 6/2016 | Jepsen ................... G09G 3/002 345/690 |
| 2016/0276806 | A1* | 9/2016 | Ohira .................... H01S 3/1055 |
| 2017/0229430 | A1 | 8/2017 | Lai et al. |
| 2018/0053878 | A1* | 2/2018 | Cich ....................... H01L 33/16 |
| 2018/0062047 | A1 | 3/2018 | Biwa et al. |
| 2019/0280157 | A1* | 9/2019 | Hu ......................... H01L 33/32 |
| 2020/0091683 | A1* | 3/2020 | Ohira ................... H01S 5/0425 |
| 2020/0161282 | A1* | 5/2020 | Kang .................. H01L 25/0657 |
| 2020/0194624 | A1* | 6/2020 | Sheng .................... H01L 33/44 |
| 2020/0203586 | A1* | 6/2020 | Kimura .................. H01L 33/46 |
| 2020/0395510 | A1* | 12/2020 | Bower ................... H01L 33/62 |
| 2020/0412094 | A1* | 12/2020 | Tsuji ................... H01S 5/18352 |
| 2021/0043618 | A1* | 2/2021 | Bower ................... H01L 33/54 |
| 2021/0044088 | A1* | 2/2021 | Murayama ........... H01S 5/0234 |

OTHER PUBLICATIONS

Written Opinion (PCT/ISA/237) dated Feb. 21, 2020 from the International Searching Authority in counterpart application No. PCT/KR2019/015515.

Shuji Nakamura and Michael R. Krames, "History of Gallium-Nitride-Based Light-Emitting Diodes for Illumination", Oct. 2013, vol. 101, No. 10, Proceedings of the IEEE, pp. 2211-2220 (10 pages total).

Gong et al., " Efficient flip-chip InGaN micro-pixellated light-emitting diode arrays: promising candidates for micro-displays and colour conversion", Apr. 4, 2008, Journal of Physics D: Applied Physics 41, pp. 1-6 (7 pages total).

* cited by examiner

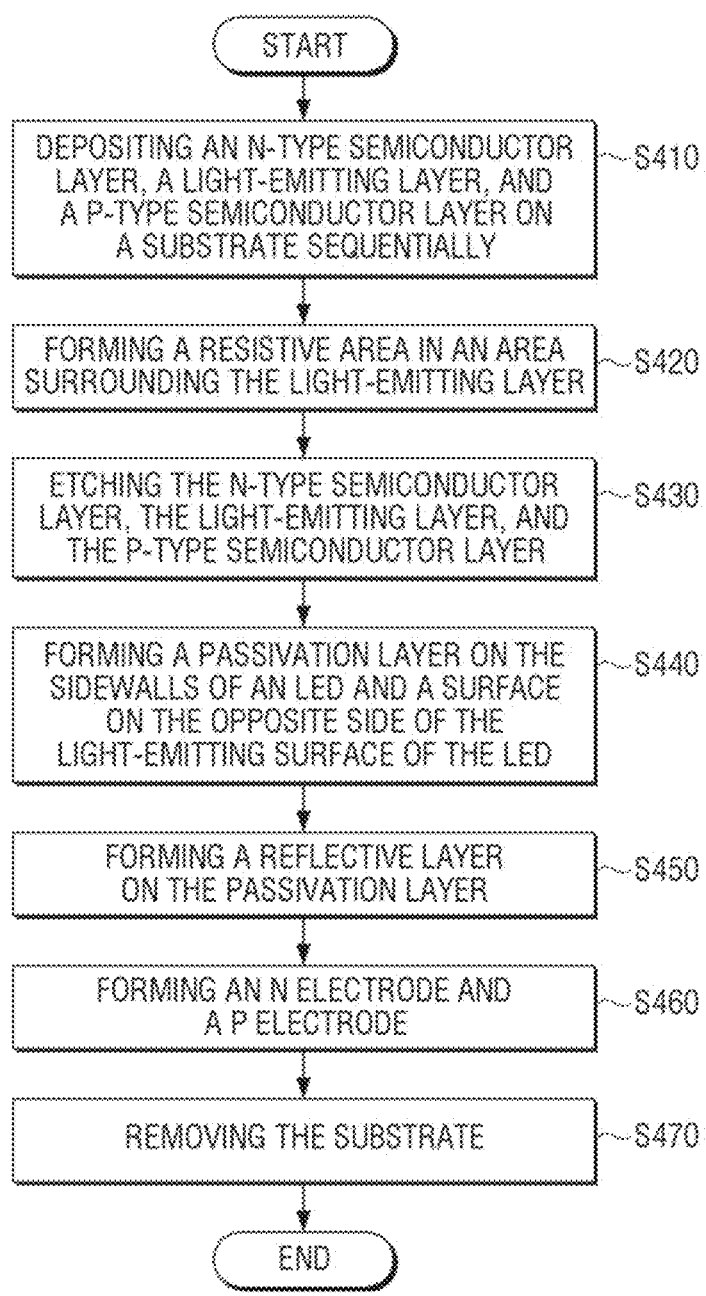

LIGHT EMITTING DIODE WITH ION IMPLANTED RESISTIVE AREA, MANUFACTURING METHOD OF LIGHT EMITTING DIODE WITH ION IMPLANTED RESISTIVE AREA AND DISPLAY DEVICE INCLUDING LIGHT EMITTING DIODE WITH ION IMPLANTED RESISTIVE AREA

CROSS-REFERENCE TO RELATED APPLICATION(S)

This application is based on and claims priority under 35 U.S.C. § 119 to Korean Patent Application No. 10-2018-0141291, filed on Nov. 16, 2018, in the Korean Intellectual Property Office, the disclosure of which is incorporated by reference herein in its entirety.

BACKGROUND

1. Field

The disclosure relates to a light-emitting diode (LED), a manufacturing method thereof, and a display device including an LED, and more particularly, to a flip-chip LED having a current confinement structure and a manufacturing method thereof, and a display device including such an LED.

2. Description of Related Art

LEDs are being applied to various industrial fields based on the relatively high light-emitting efficiency and long lifespan of LEDs. In particular, LEDs are being commercialized in the field of displays, as well as in the field of general lighting.

Meanwhile, in particular, following the trend of high performance and high efficiency of display devices, there is a continued demand for improving the light-emitting efficiency of LEDs. In particular, in the field of development of nano-scale LEDs, such as micro LEDs, improvement of the light emitting efficiency of diodes is emerging as an important task to be resolved along with improvement of efficiency in terms of processes.

Accordingly, there has been a continued effort for improving the light-emitting efficiency of LEDs. Specifically, as a method for improving internal quantum efficiency (IQE), an LED in a vertical type having a current confinement structure has been developed.

However, in the case of an LED in a vertical type, an electrode is arranged on a light-emitting surface of an LED, and thus there is a limitation that the light extraction efficiency (LEE) decreases accordingly, and the light emitting efficiency is reduced. Thus, there is a need for development of LEDs with high efficiency which comprehensively considers various factors that can contribute to improvement of light emitting efficiency, as well as formation of a current confinement structure.

In addition, in the case of an LED in a vertical type, there is also a limitation in terms of efficiency of a formation process of an electrode layer and a transferring process of forming an electronic connection part. In contrast, in the case of a flip-chip LED, a flip-chip LED has a structure that is advantageous for miniaturization, weight reduction, and high integration of a single diode, and also, light-emitting efficiency, efficiency of a transferring process, etc. can be improved in manufacturing a display device.

Accordingly, there is an emerging need for an LED which has the aforementioned advantages of a flip-chip LED, and at the same time, which has a structure improving light-emitting efficiency such as a current confinement structure.

SUMMARY

The present disclosure provides a flip-chip LED with high efficiency including a current confinement structure and a manufacturing method thereof, and a display device including such an LED.

According to an aspect of the disclosure, flip-chip light-emitting diode (LED) may include a light-emitting layer; an n-type semiconductor layer disposed on an upper surface of the light-emitting layer; a p-type semiconductor layer disposed on a lower surface of the light-emitting layer; an n-electrode connected to the n-type semiconductor layer; a p-electrode connected to the p-type semiconductor layer; a passivation layer disposed on sidewalls of the LED and a surface on an opposite side of a light-emitting surface of the LED; a reflective layer disposed on the passivation layer, and that reflects light emitted from the light-emitting layer; and a resistive area disposed on side surfaces of the light-emitting layer, and that restricts current flow from the light-emitting layer to the sidewalls.

The resistive area may be disposed on side surfaces of the entire p-type semiconductor layer, on the side surfaces of the entire light-emitting layer, and on side surfaces of a portion of the n-type semiconductor layer.

The resistive area may be disposed on the light-emitting layer, the n-type semiconductor layer, and the p-type semiconductor layer by ion-implantation.

The reflective layer may be a metal reflector or distributed-Bragg-reflector structure.

The LED may include a contact hole that passes through the p-type semiconductor layer and the light-emitting layer, and connects the n-electrode to the n-type semiconductor layer. The resistive area surrounds the contact hole and restricts the current flow from the light-emitting layer to the contact hole.

The LED has an area less than or equal to 10,000 mm$^2$.

According to an aspect of the disclosure, a manufacturing method of a flip-chip light-emitting diode (LED) may include depositing an n-type semiconductor layer, a light-emitting layer, and a p-type semiconductor layer on a substrate; forming a resistive area on side surfaces of the light-emitting layer; etching the n-type semiconductor layer, the light-emitting layer, and the p-type semiconductor layer; forming a passivation layer on sidewalls of the LED, and a surface on an opposite side of a light-emitting surface of the LED; forming a reflective layer on the passivation layer; forming an n-electrode to connect to the n-type semiconductor layer; forming a p-electrode to connect to the p-type semiconductor layer; and removing the substrate.

The resistive area may be formed on side surfaces of the entire p-type semiconductor layer, on the side surfaces of the entire light-emitting layer, and on side surfaces of a portion of the n-type semiconductor layer.

The resistive area may be formed on the light-emitting layer, the n-type semiconductor layer, and the p-type semiconductor layer by ion-implantation.

The reflective layer may be a metal reflector or distributed-Bragg-reflector structure.

The manufacturing method of the LED may include forming a contact hole that passes through the p-type semiconductor layer and the light-emitting layer to connect the n-electrode to the n-type semiconductor layer. The resistive area may be formed to surround the contact hole, and restricts a current flow from the light-emitting layer to the contact hole.

The LED may have an area less than or equal to 10,000 mm².

According to an aspect of the disclosure, a display device may include a display panel having a plurality of flip-chip light emitting diodes (LEDs) and a plurality of pixel driving circuits for driving the plurality of LEDs, and that is divided into a plurality of pixels arranged in a form of a matrix.

Each of the plurality of LEDs may include a light-emitting layer; an n-type semiconductor layer disposed on an upper surface of the light-emitting layer; a p-type semiconductor layer disposed on a lower surface of the light-emitting layer; an n-electrode connected to the n-type semiconductor layer; a p-electrode connected to the p-type semiconductor layer; a passivation layer disposed on sidewalls of the LED and a surface on an opposite side of a light-emitting surface of the LED; a reflective layer disposed on the passivation layer, and that reflects light emitted from the light-emitting layer; and a resistive area disposed on side surfaces of the light-emitting layer, and that restricts current flow from the light-emitting layer to the sidewalls.

Each of the plurality of pixels may include an R sub pixel comprising red LEDs, a G sub pixel comprising green LEDs, and a B sub pixel comprising blue LEDs, and the plurality of pixel driving circuits may be formed with respect to each of the R sub pixel, the G sub pixel, and the B sub pixel.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4 is a flow chart for illustrating a manufacturing method of an LED according to an embodiment;

DETAILED DESCRIPTION

Figure 1:
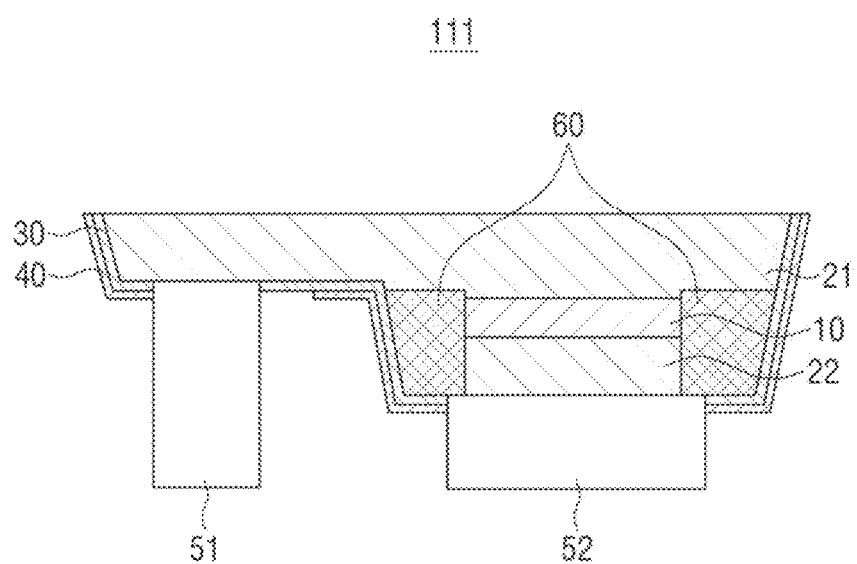
FIG. 1 is a sectional view for illustrating a configuration of an LED according to an embodiment.

Various modifications may be made to the embodiments of the disclosure, and there may be various types of embodiments. Accordingly, specific embodiments will be illustrated in drawings, and the embodiments will be described in detail in the detailed description. However, it should be noted that the various embodiments do not limit the scope of the disclosure to a specific embodiment, and that they should be interpreted to include various modifications, equivalents, and/or alternatives of the embodiments of the disclosure. Also, with respect to the detailed description of the drawings, similar components may be designated by similar reference numerals.

Meanwhile, in explaining the disclosure, in case it is determined that detailed explanation of related known functions or features may unnecessarily confuse the gist of the disclosure, the detailed explanation may be omitted.

In addition, the embodiments below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

Terms used in the disclosure may describe specific embodiments, and are not intended to limit the scope of protection of the disclosure. Also, singular expressions of terms may include the plural expressions of the terms, unless defined the context clearly indicates otherwise.

In the disclosure, expressions such as "have," "may have," "include," "may include," and the like, should be construed as denoting that there are such characteristics (e.g., elements such as numerical values, functions, operations and components), and the expressions are not intended to exclude the existence of additional characteristics.

Also, in the disclosure, the expressions "A or B," "at least one of A and/or B," or "one or more of A and/or B," and the like, may include all possible combinations of the listed items. For example, "A or B," "at least one of A and B" or "at least one of A or B" refer to all of the following cases: (1) including at least one A, (2) including at least one B, or (3) including at least one A and at least one B.

Further, expressions such as "first," "second," etc., used in the disclosure may be used to describe various elements regardless of any order and/or degree of importance. Also, such expressions may be used to distinguish one element from another element, and are not intended to limit the elements.

Also, the description in the disclosure that one element (e.g., a first element) is "(operatively or communicatively) coupled with/to" or "connected to" another element (e.g., a second element) may be interpreted to include both the case where the one element is directly coupled to the another element, and the case where the one element is coupled to the another element via still another element (e.g., a third element).

In contrast, the description that one element (e.g., a first element) is "directly coupled" or "directly connected" to another element (e.g., a second element) may be interpreted to mean that still another element (e.g., a third element) does not exist between the one element and the another element.

Meanwhile, various elements and areas in drawings are illustrated schematically for convenience. Accordingly, the technical idea of the disclosure is not limited by the relative sizes or intervals illustrated in the accompanying drawings.

Hereinafter, embodiments of the disclosure will be described in detail with reference to the accompanying drawings to the extent that those having ordinary skill in the art to which the disclosure belongs may carry out the embodiments.

Before explaining an LED according to the disclosure in detail, factors influencing the light-emitting efficiency of an LED will be explained. In principle, the light-emitting efficiency of an LED varies according to internal quantum efficiency (IQE) and external quantum efficiency (EQE).

Internal quantum efficiency is a measure of a capacity to generate photons inside an LED, and a function of the quality and configuration of an LED. Meanwhile, external quantum efficiency is defined as dividing the number of emitted photons by the number of injected electrons. Also, external quantum efficiency is a function of the internal quantum efficiency and light extraction efficiency (LEE) of an LED. Also, light extraction efficiency is determined by an optical design of an LED.

The display according to the disclosure may be installed in and applied to a wearable device, a portable device, a handheld device, and an electronic device including a display, and may be applied to a display device such as a monitor for a personal computer (PC), a high resolution TV, a sign, and the like.

Hereinafter, a configuration of an LED devised to improve the light-emitting efficiency of an LED by improving the internal quantum efficiency and external quantum efficiency of the LED, and an effect thereof will be explained.

FIG. 1 is a sectional view for illustrating a configuration of an LED according to an embodiment.

As illustrated in FIG. 1, an LED 111 according to an embodiment includes a light-emitting layer (e.g., an active layer) 10, an n-type semiconductor layer 21, a p-type semiconductor layer 22, an n-electrode 51, a p-electrode 52, a passivation layer 30, a reflective layer 40, and a resistive area 60.

The light emitting layer 10, the n-type semiconductor layer 21, and the p-type semiconductor layer 22 may include various semiconductors having band gaps corresponding to specific areas in a spectrum. For example, a red LED 111 having a light wavelength of 600-750 nm may include one or more layers based on an AlInGaP-based semiconductor. Also, blue and green LEDs 111 respectively having a light wavelength of 450-490 nm and a light wavelength of 500-570 nm may include one or more layers based on an AlInGaN-based semiconductor.

The n-type semiconductor layer 21 and the p-type semiconductor layer 22 may be implemented as semiconductors of compounds such as a III-V group, a II-VI group, etc. In particular, the n-type semiconductor layer 21 and the p-type semiconductor layer 22 may be implemented as nitride semiconductor layers, particularly GaN semiconductor layers. However, the n-type semiconductor layer 21 and the p-type semiconductor layer 22 according to the disclosure are not limited thereto, and they may include various materials according to various characteristics of the LED 111.

An n-type semiconductor is a semiconductor wherein free electrons are used as carriers for transferring electric charges, and it may be manufactured by doping n-type dopants such as Si, Ge, Sn, Te, etc. A p-type semiconductor is a semiconductor wherein holes are used as carriers for transferring electric charges, and it may be manufactured by doping p-type dopants such as Mg, Zn, Ca, Ba, etc.

The light emitting layer 10 is located between the n-type semiconductor layer 21 and the p-type semiconductor layer 22, and is a layer wherein electrons which are carriers of the n-type semiconductor layer 21 and holes which are carriers of the p-type semiconductor layer 22 meet. When electrons and holes meet on the light emitting layer 10, a potential barrier is formed as electrons and holes recombine. Then, when electrons and holes cross over the potential barrier and shift to a low energy level according to an applied voltage, light of a wavelength corresponding thereto is emitted.

Here, the light emitting layer 10 may have a multi-quantum wells (MQW) structure, but the disclosure is not limited thereto, and the light emitting layer 10 may have various structures such as a single-quantum well (SQW) structure or a quantum dot (QD) structure, etc.

In case the light emitting layer 10 is formed in a multi-quantum wells structure, the well layer/the barrier layer of the light emitting layer 10 may be formed in structures such as InGaN/GaN, InGaN/InGaN, and GaAs(InGaGs)/AlGaAs, but the disclosure is not limited to the aforementioned structures. Also, the number of quantum wells included in the light emitting layer 10 is not limited to a specific number.

So far, explanation was made only regarding the light emitting layer 10, the n-type semiconductor layer 21, and the p-type semiconductor layer 22, but the LED 111 according to the disclosure may include various semiconductor layers other than the foregoing layers. For example, the LED 111 according to the disclosure may further include a $p^+$-type semiconductor layer or an $n^+$-type semiconductor layer manufactured by overdoping dopants, such that current distribution is improved and uniform light emission becomes possible in the entire chip.

The n-electrode 51 is electronically connected to the n-type semiconductor layer 21, and the p-electrode 52 is electronically connected to the p-type semiconductor layer 22. Specifically, the n-electrode 51 and the p-electrode 52 form ohmic contact with the n-type semiconductor layer 21 and the p-type semiconductor layer 22, and are thereby electronically connected to the n-type semiconductor layer 21 and the p-type semiconductor layer 22. Also, the n-electrode 51 and the p-electrode 52 may include Al, Ti, Ni, Pd, Ag, Au, and Au—Ge, and oxides such as indium-tin-oxide (ITO) and ZnO.

When voltages are applied through the n-electrode 51 and the p-electrode 52, electrons inside the n-type semiconductor move toward the (+) terminal, and holes inside the p-type semiconductor move toward the (−) terminal, and currents get to flow by minority carriers formed accordingly.

Although not illustrated in FIG. 1, in an area passing through at least one of the light emitting layer 10, the n-type semiconductor layer 21, or the p-type semiconductor layer 22, a contact hole 70 may be formed. Also, at least one electrode between the n-electrode 51 and the p-electrode 52 may be electronically connected to the n-type semiconductor layer 21 or the p-type semiconductor layer 22 via the contact hole 70. An embodiment wherein the LED 111 according to the disclosure includes a contact hole 70 for connection between electrodes and semiconductor layers will be described in detail in the explanation regarding FIG. 3.

The n-electrode 51 and the p-electrode 52 may be formed on a surface on the opposite side of the light emitting surface of the LED 111 from which light is emitted. That is, as illustrated in FIG. 1, the LED 111 according to the disclosure has a flip-chip structure wherein both of the n-electrode 51 and the p-electrode 52 are formed on a surface on the opposite side of the light emitting surface. The LED 111 of a flip-chip type will be described in detail in the explanation regarding FIGS. 2A to 2C.

The passivation layer 30 is formed on the sidewalls of the LED 111 and a surface on the opposite side of the light emitting surface of the LED 111. The passivation layer may include insulating materials such as $Al_2O_3$, SiN, $SiO_2$, and the like. Also, the passivation layer 30 performs a role of making the light emitting layer 10, the n-type semiconductor layer 21, and the p-type semiconductor layer 22 electronically distinguished from a reflective layer 40.

As illustrated in FIG. 1, the passivation layer 30 has an opening area which permits the p-electrode 52 and the n-electrode 51 to be electronically connected to the p-type semiconductor layer 22 and the n-type semiconductor layer 21.

The reflective layer 40 is formed on the passivation layer 30 as described above. That is, similar to the passivation layer 30, the reflective layer 40 is also formed on the sidewalls of the LED 111 and a surface on the opposite side of the light emitting surface of the LED 111. For the reflective layer 40, various metal materials having high reflectivity such as aluminum (Al) may be used, but the reflective layer 40 according to the disclosure is not limited to a specific material.

The reflective layer 40 may be formed in a metal reflector or distributed-Bragg-reflector (DBR) structure.

Specifically, a distributed-Bragg-reflector structure may be implemented as a multi-layer structure wherein two layers having different refractive indices are laminated alternatingly. Also, in accordance thereto, Fresnel reflection is generated on the interface of each layer due to the difference in the refractive indices between two different layers, and according to the material and its thickness included in the multi-layer structure, all reflected waves generate constructive interference. Accordingly, the reflective layer 40 formed in a distributed-bragg-reflector structure gets to have high reflectivity.

According to an embodiment of the disclosure, the reflective layer 40 formed on the sidewalls of the LED 111 may be formed at an angle of from 1 degree to 85 degrees based on a surface on the opposite side of the light-emitting surface.

The reflective layer 40 as described above performs a role of reflecting light emitted from the light-emitting layer 10 in the direction of the light-emitting surface. Specifically, in case light emitted from the light emitting layer 10 is toward the sidewalls of the LED 111 and a surface on the opposite side of the light emitting surface of the LED 111, the reflective layer 40 may reflect the light in the direction of the light-emitting surface, and as a result thereof, the light extraction efficiency of the LED 111 can be improved.

The resistive area 60 is formed in an area surrounding the light emitting layer 10. The resistive area 60 may be formed in an area surrounding the light-emitting layer 10, and may also be formed in an area surrounding the side surfaces of the p-type semiconductor layer 22 and the n-type semiconductor layer 21. Specifically, the resistive area 60 may be formed in a depth including the entire p-type semiconductor layer 22, the entire light emitting layer 10, and a portion of the n-type semiconductor layer 21. This is because, in case the resistive area 60 is formed by an ion-implantation process that will be described later, ion-implantation is performed starting from the upper part of the p-type semiconductor layer 22 to the upper part of the n-type semiconductor layer 21.

The total width of the resistive area 60 may be formed to correspond to 30% of the entire width of the LED 111. However, this is merely an example, and the width of the resistive area 60 may be determined in consideration of an effect according to reduction of the width of the light emitting layer 10 along with an effect according to formation of the resistive area 60.

The resistive area 60 has higher resistivity than the path of currents flowing through the light emitting layer 10. Specifically, the resistive area 60 may include a material having higher resistivity than the material included in the light emitting layer 10. In addition, the resistive area 60 may include a material having higher resistivity than the materials included in the n-type semiconductor layer 21 and the p-type semiconductor layer 22.

The material characteristic of the resistive area 60 as above may be implemented by ion-implantation. Specifically, the resistive area 60 may be formed by ion-implantation for the light emitting layer 10, the n-type semiconductor layer 21, and the p-type semiconductor layer 22.

An ion-implantation process is a process of applying an electric field to charged ions and implanting the ions into a target object by accelerating them, and is used for doping impurities in an exact amount to a desired place. Specifically, an ion-implantation process is performed through a process of ionizing an ion source, and extracting desired ions, and then applying an electric field to the selected ions and thereby accelerating the ions and making them collide with semiconductors, and implanting the ions into the semiconductors.

The depth of ion-implantation according to an ion-implantation process can be controlled by adjusting the acceleration energy, and the amount of impurities can be controlled by adjusting ion currents while ions are being implanted.

Meanwhile, according to an embodiment of the disclosure, if the LED 111 is a red LED 111, then the resistive area 60 may be formed by implanting H, Al, and O as ion sources. If the LED 111 is a green LED 111, then the resistive area 60 may be formed by implanting N as an ion source. If the LED 111 is a blue LED 111, then the resistive area 60 may be formed by implanting Al, Fe, and C as ion sources. However, these are merely examples, and the types of ion sources implanted into the resistive area 60 are not limited.

Formation of the resistive area 60 according to the disclosure may be performed by ion-implantation, and the resistive area 60 may be implemented to include a material having higher resistivity than the light emitting layer 10 by various other methods.

The resistive area 60 as described above performs a role of restricting currents flowing through the light emitting layer 10 from flowing to the sidewalls. Hereinafter, an effect according to formation of the resistive area 60 will be described in detail.

In a general manufacturing process of an LED, the light emitting layer 10, the n-type semiconductor layer 21, and the p-type semiconductor layer 22 are etched by a dry etching technology, and may cause defects in high density in the area of etched sidewalls in this case.

Around the area of sidewalls wherein such defects exist, non-radiative recombination of implanted carriers occurs. Non-radiative recombination refers to a phenomenon wherein holes and electrons do not entail radiation when they recombine in a semiconductor, and the energy that the electrons had is emitted as heat. In other words, when non-radiative recombination occurs, energy in the form of photons is not emitted by recombination of holes and electrons, but energy in the form of phonons is emitted.

Accordingly, as additional non-radiative recombination occurs, internal quantum efficiency is further reduced. In particular, non-radiative recombination exerts a noticeable influence on the light-emitting efficiency of the LED 111, and is thus a problem to be resolved in improving the light-emitting efficiency of the LED 111.

As described above, the LED 111 according to the disclosure includes a resistive area 60 in an area surrounding the light emitting layer 10, and accordingly, flow of current through the light emitting layer 10 to the sidewalls having defects is restricted. Also, by formation of the resistive area 60, the LED 111 according to the disclosure may include a current confinement structure.

That is, the resistive area 60 according to the disclosure provides a structure in which the sidewalls having defects are spaced apart from and the path of current, thereby suppressing non-radiative recombination on the sidewalls. Accordingly, the internal quantum efficiency inside the LED 111 is improved, and consequently, the light emitting efficiency and stability of light output of the LED 111 are improved.

As illustrated in FIG. 1, the LED 111 according to the disclosure may not include a substrate 80. That is, according to the disclosure, a wafer used as a substrate 80 for epitaxial growth of the light-emitting layer 10, the n-type semiconductor layer 21, and the p-type semiconductor layer 22 may be removed. Removal of a substrate 80 according to the disclosure and an effect resulting therefrom will be described in detail in the explanation regarding FIGS. 4 and 5A to 5D.

Meanwhile, there is no specific limitation on the size of the LED 111 according to the disclosure, but according to an embodiment of the disclosure, the LED 111 may be a micro LED 111. A micro LED 111 may refer to an LED 111 having an area less than or equal to 10,000 mm². To be more specific, a micro LED 111 may be implemented in a form of which horizontal and vertical lengths are both greater than or equal to 1 mm and less than or equal to 100 mm.

A micro LED is gaining a lot of attention as a light source forming individual pixel elements in a display device, and for realizing such an application, high light-emitting efficiency of the micro LED 111 may be desired.

However, as the area ratio of sidewalls of a micro LED is broad compared to the size of a device, reduction of internal quantum efficiency by non-radiative recombination as described above may be increased.

Accordingly, an effect of improvement of the light-emitting efficiency of the LED 111 according to the disclosure may be expressed more noticeably particularly in the case of the micro LED 111. However, there is no specific limitation on the size of the LED 111 according to the disclosure, and the size may be implemented as various sizes.

As described above, the LED 111 according to an embodiment of the disclosure has a flip-chip structure. The configuration of the flip-chip LED 111 according to the disclosure and an effect of improvement of light extraction efficiency resulting therefrom will be described in detail in the explanation regarding FIGS. 2A to 2C below.

Figure 2A:
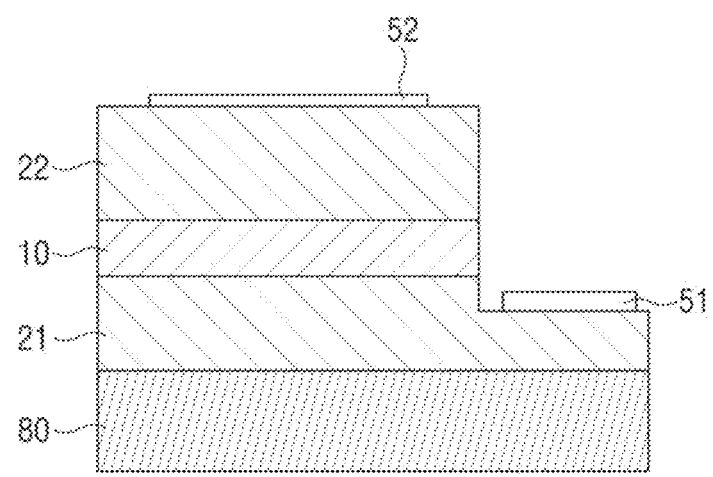
FIG. 2A is a sectional view for illustrating a configuration of a flip-chip LED according to an embodiment.
Figure 2B:
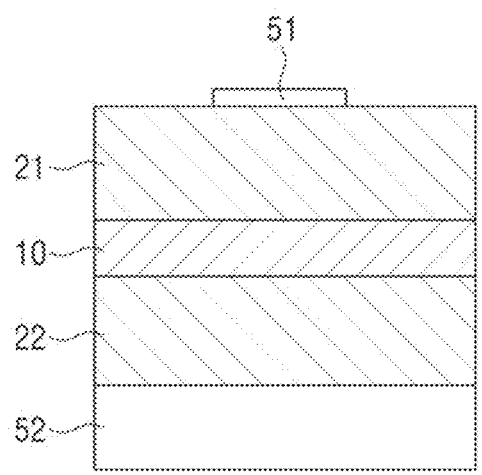
FIG. 2B is a sectional view for illustrating a configuration of a flip-chip LED according to an embodiment.
Figure 2C:
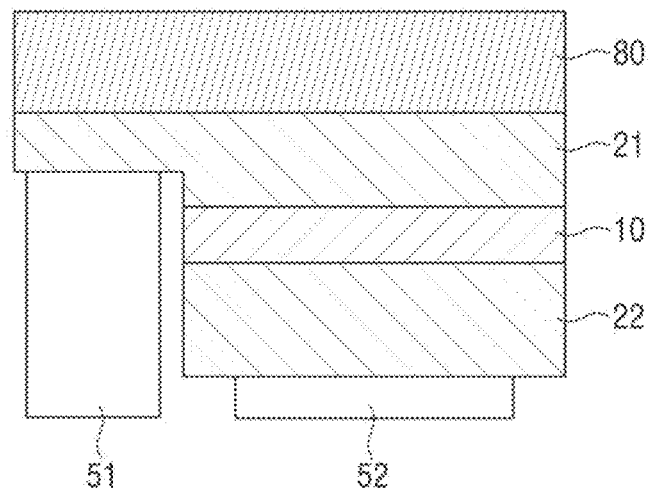
FIG. 2C is a sectional view for illustrating a configuration of a flip-chip LED according to an embodiment.

FIGS. 2A to 2C are sectional views for illustrating a configuration of a flip-chip LED according to an embodiment of the disclosure in comparison with an LED of a different type.

That is, FIGS. 2A to 2C may explain a general configuration and advantages of a flip-chip type adopted according to the disclosure in detail in comparison with LEDs in a general lateral type and a general vertical type. Also, in FIGS. 2A to 2C, the same reference numerals in the drawings related to the disclosure are used for components corresponding to the components of the LED according to the disclosure, but this is merely for the convenience of explanation.

In general, configurations of LEDs may be roughly divided into a lateral type and a vertical type based on arrangement forms of electrodes. Also, a lateral type may be sub-divided into an upper part emission type and a lower part emission type based on a surface that emits light. Here, a lower part may refer to a side wherein a substrate of an LED is located, and an upper part may refer to the opposite side of a substrate. As will be described later, in the case of the LED according to the disclosure, a substrate for growth of a semiconductor layer is removed in the manufacturing process thereof, and accordingly, a lower part in this case may be interpreted as a side wherein a substrate is located before being removed.

In the case of an upper part emission type LED among LEDs of a lateral type, an electrode is formed on the same surface as the surface emitting light. In the case of a lower part emission type LED among LEDs of a lateral type, an electrode is formed on the opposite side of the surface that emits light.

A lower part emission type LED among LEDs of a lateral type is generally called as a flip-chip LED. Accordingly, hereinafter, an upper part emission type LED among LEDs of a lateral type will be simply referred to as an LED of a lateral type, and a lower part emission type LED among LEDs of a lateral type will be referred to as a flip-chip LED.

FIG. 2A is a sectional view illustrating an LED of a general lateral type, FIG. 2B is a sectional view illustrating an LED of a general vertical type, and FIG. 3B is a sectional view illustrating a general configuration of a flip-chip LED which is a configuration adopted for the LED according to the disclosure.

As illustrated in FIG. 2A, an LED of a lateral type includes a light-emitting layer 10, an n-type semiconductor layer 21, a p-type semiconductor layer 22, an n-electrode 51, and a p-electrode 52 on a substrate 80. Here, the n-electrode 51 and the p-electrode 52 are arranged in parallel with each other, and light is emitted to the upper part of the LED.

As described above, in the case of an LED of a lateral type, an electrode is formed on a surface that emits light. Thus, there is a problem that light extraction efficiency is reduced due to a shading effect by an electrode. In addition, as an electrode is located in the upper part of the LED, a wire may be used for interconnecting a backplane arranged in the direction of the lower part and the LED, and accordingly, manufacturing cost is increased.

As illustrated in FIG. 2B, an LED of a vertical type also includes a light-emitting layer 10, an n-type semiconductor layer 21, a p-type semiconductor layer 22, an n-electrode 51, and a p-electrode 52. Here, a substrate 80 is a conductive substrate, and performs the role of the p-electrode 52. In the case of an LED of a vertical type, an electrode is also formed on a surface that emits light. Thus, there is a problem of reduction of light extraction efficiency due to a shading effect by an electrode. In addition, like in the case of an LED of a lateral type, manufacturing cost is increased for interconnecting an electrode located in the upper part of the LED and a backplane.

Specifically, in the case of an LED of a vertical type, the n-electrode 51 and the p-electrode 52 are located on different surfaces of a diode, and thus wiring should be formed on both side surfaces of an LED. In particular, for interconnecting electrodes in the upper part, additional processes such as formation of vias, masking, formation of interlayer insulating layers, and electroplating may be required.

As illustrated in FIG. 2C, in the case of a flip-chip LED, the n-electrode 51 that is electronically connected to the n-type semiconductor layer 21, and the p-electrode 52 that is electronically connected to the p-type semiconductor layer 22 are arranged on the same surface, and light is emitted towards the lower part which is the side wherein the substrate 80 of the LED is located.

Here, arrangement on the same surface may refer to both of the n-electrode 51 and the p-electrode 52 being formed on a surface on the opposite side of the light-emitting surface of the LED, and might not refer to one surface of the n-electrode 51 and one surface of the p-electrode 52 being formed on the same layer.

As described above, in the case of a flip-chip LED, an electrode is not formed on a surface that emits light. Accordingly, unlike in the case of LEDs of a lateral type or a vertical type, reduction of light extraction efficiency due to a shading effect may not occur.

In addition, in the case of a flip-chip LED, in coupling with a backplane, an electrode is welded directly by using an electrode pattern without using an additional connecting structure such as a wire or an intermediate medium such as a ball grid array (BGA). Accordingly, in the case of a flip-chip LED, efficiency of a transferring process is high, and as no separate space for a wire is needed, the LED is advantageous for miniaturization, weight reduction, and high integration of a single diode.

Figure 3:
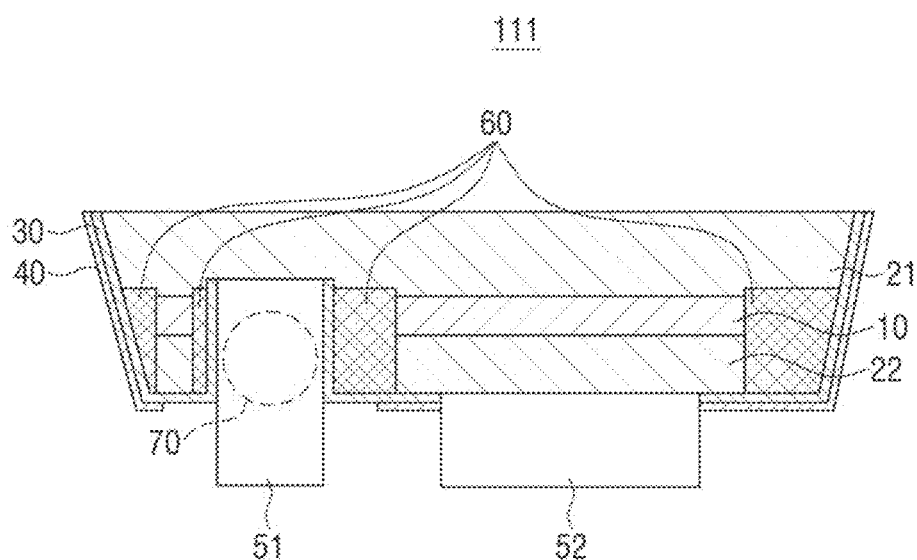
FIG. 3 is a sectional view for illustrating a configuration of an LED including a contact hole according to an embodiment.

FIG. 3 is a sectional view for illustrating a configuration of an LED including a contact hole according to an embodiment of the disclosure.

So far, explanation was made based on the assumption of a configuration as illustrated in FIG. 1 as an example of the LED 111 according to the disclosure. However, the configuration of the LED 111 according to the disclosure may be changed in various ways.

Referring to FIG. 3, the LED 111 includes a light-emitting layer 10, an n-type semiconductor layer 21, a p-type semiconductor layer 22, a passivation layer 30, a reflective layer 40, an n-electrode 51, a p-electrode 52, and a resistive area 60. As explanation in this regard was made regarding FIG. 1 above, overlapping explanation may be omitted. However, in the case of the LED 111 as illustrated in FIG. 3, the LED 111 further includes a contact hole 70 unlike in the case of the LED 111 as illustrated in FIG. 1.

That is, the LED 111 according to the disclosure further includes a contact hole 70 that is formed so as to pass through the p-type semiconductor layer 22 and the light emitting layer 10 and electronically connects the n-electrode 51 to the n-type semiconductor layer.

The contact hole 70 may be formed by dry etching, and accordingly, defects in high density may occur in the area of the etched contact hole 70 as in the area of the sidewalls of the LED 111.

Also, around the contact hole 70 wherein defects exist, non-radiative recombination of implanted carriers may occur as in the area of the sidewalls of the LED 111. Accordingly, reduction of internal quantum efficiency according to non-radiative recombination may also be caused around the contact hole 70. Thus, in the case of the LED 111 wherein the contact hole 70 is formed as illustrated in FIG. 3, there may be a need to restrict currents flowing through the light emitting layer 10 from flowing to the contact hole 70 wherein defects exist.

Accordingly, according to an embodiment of the disclosure as illustrated in FIG. 3, a resistive area 60 is additionally formed in an area surrounding the contact hole 70. Also, current flow through the light emitting layer 10 to the contact hole 70 is restricted in accordance thereto, and thus reduction of internal quantum efficiency according to occurrence of non-radiative recombination in the area of the contact hole 70 can be reduced.

FIG. 4 is a flow chart for illustrating a manufacturing method of an LED according to an embodiment of the disclosure, and FIGS. 5A to 5D are diagrams for illustrating each step of a manufacturing method of an LED according to an embodiment of the disclosure in detail.

Hereinafter, explanation will be made with reference to FIGS. 4 and 5A to 5D. As the configuration of the LED 111 according to an embodiment of the disclosure and the characteristics of each layer included in the LED 111, etc. were described in the explanation regarding FIGS. 1 to 3 above, overlapping explanation may be omitted.

The substrate 80 used in the manufacturing method of the LED 111 according to an embodiment of the disclosure may be a material suitable for growth of a semiconductor material or a carrier wafer, etc. Specifically, the substrate 80 may include materials such as sapphire, $Al_2SO_4$, SiC, GaN, GaAs, ZnO, etc., but the substrate 80 used in the disclosure is not limited to a specific material.

Figure 5A:
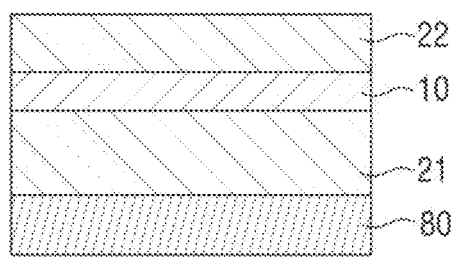
FIG. 5A is a diagram for illustrating each step of a manufacturing method of an LED according to an embodiment.

When the substrate 80 is provided, the n-type semiconductor layer 21, the light-emitting layer 10, and the p-type semiconductor layer 22 are deposited sequentially on the substrate 80 as illustrated in FIG. 5A at operation S410. Specifically, the n-type semiconductor layer 21 is deposited on the substrate 80, and the light-emitting layer 10 is deposited in the upper part of the deposited n-type semiconductor layer 21, and the p-type semiconductor layer 22 is deposited in the upper part of the deposited light-emitting layer 10.

Also, semiconductor layers having various properties may be additionally laminated in the upper parts or lower parts of the n-type semiconductor layer 21 and the p-type semiconductor layer 22.

Deposition as described above may be performed by utilizing process technologies such as metalorganic vapor phase epitaxy (MOVPE), metal organic chemical vapor deposition (MOCVD), and molecular beam epitaxy (MBE).

When the n-type semiconductor layer 21, the light-emitting layer 10, and the p-type semiconductor layer 22 are deposited, a resistive area 60 is formed in an area surrounding the light emitting layer 10 at operation S420. The resistive area 60 may be formed in a depth including the entire p-type semiconductor layer 22, the entire light emitting layer 10, and a portion of the n-type semiconductor layer 21. This is because the resistive area 60 is formed by an ion-implantation process that will be described later.

Figure 5B:
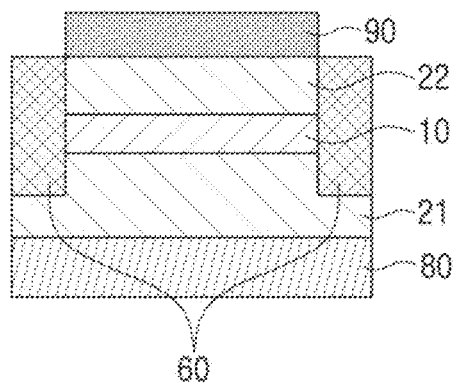
FIG. 5B is a diagram for illustrating each step of a manufacturing method of an LED according to an embodiment.

The width of the resistive area 60 is determined based on the surface of the p-type semiconductor layer 22 being masked through a mask 90, as illustrated in FIG. 5B. Then, the resistive area 60 is formed as ions are implanted inside the surface of the p-type semiconductor layer 22 through an ion-implantation process.

The depth of ion-implantation may be determined by controlling the acceleration voltage or other variables of ionic specifies during an ion-implantation process. As illustrated in FIG. 5B, the resistive area 60 may be formed in a depth including the entire p-type semiconductor layer 22, the entire light-emitting layer 10, and a portion of the n-type semiconductor layer 21.

An ion-implantation process is a process of applying an electric field to charged ions and implanting the ions into a target object by accelerating them, and is used for doping impurities in an exact amount to a desired place. Specifically, an ion-implantation process is performed through a process of ionizing an ion source, and extracting desired ions, and then applying an electric field to the selected ions and thereby accelerating the ions and making them collide with semiconductors, and implanting the ions into the semiconductors.

The depth of ion-implantation according to an ion-implantation process can be controlled by adjusting the acceleration energy, and the amount of impurities can be controlled by adjusting ion currents while ions are being implanted.

According to an embodiment of the disclosure, if the LED 111 is a red LED 111, then the resistive area 60 may be formed by implanting H, Al, and O as ion sources. If the LED 111 is a green LED 111, then the resistive area 60 may be formed by implanting N as an ion source. If the LED 111 is a blue LED 111, then the resistive area 60 may be formed by implanting Al, Fe, and C as ion sources. However, these are merely examples, and the types of ion sources implanted into the resistive area 60 are not limited.

Formation of the resistive area 60 according to the disclosure may be performed by ion-implantation, and the resistive area 60 may be implemented to include a material having higher resistivity than the light emitting layer 10 by various other methods.

The resistive area 60 as described above performs a role of restricting current flow through the light emitting layer 10 from flowing to the sidewalls. That is, the resistive area 60 according to the disclosure spaces the sidewalls having defects and the current path apart from each other, and thereby suppresses non-radiative recombination on the sidewalls. Accordingly, the internal quantum efficiency inside the LED 111 is improved, and consequently, the light-emitting efficiency of the LED 111 is improved.

Figure 5C:
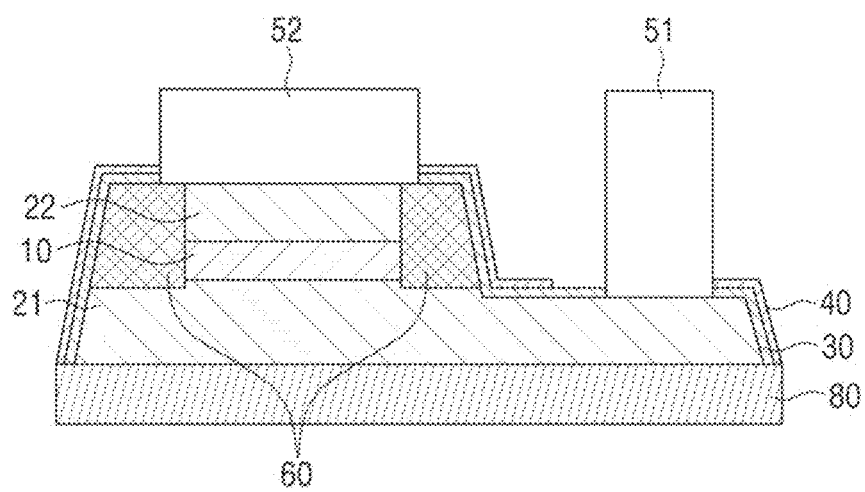
FIG. 5C is a diagram for illustrating each step of a manufacturing method of an LED according to an embodiment.
Figure 5D:
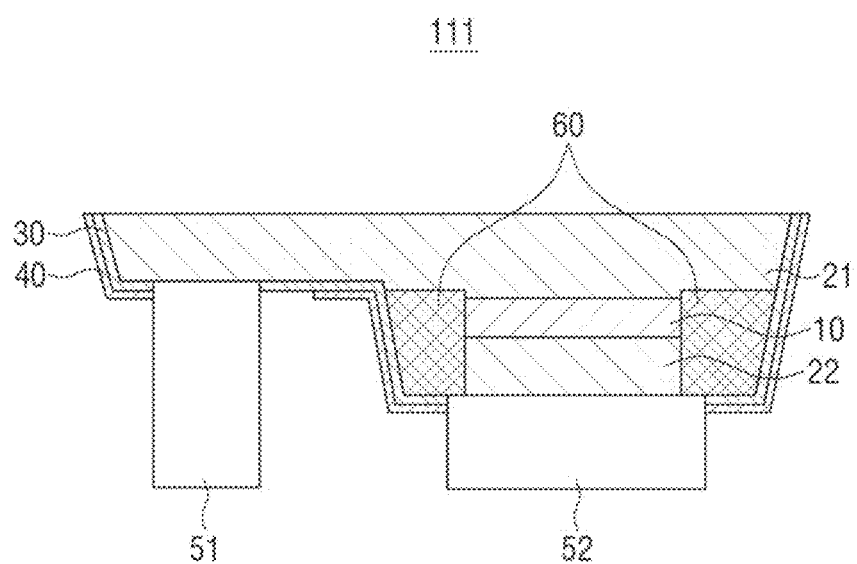
FIG. 5D is a diagram for illustrating each step of a manufacturing method of an LED according to an embodiment.

Hereinafter, subsequent processes will be explained with reference to FIG. 5C which schematically illustrates processes after the resistive area 60 is formed. That is, in FIG. 5C, a plurality of processes are illustrated in one drawing, and this is for schematically illustrating processes performed through process technologies.

When the resistive area 60 is formed, the n-type semiconductor layer 21, the light-emitting layer 10, and the p-type semiconductor layer 22 are etched at operation S430. Specifically, etching may be performed by using a wet etching or dry etching technology. For example, etching may be performed by using a dry etching technology such as reactive ion etching (RIE), electro-cyclotron resonance (ECR), inductively coupled plasma reactive ion etching (ICP-RIE), chemically assisted ion-beam etching (CAIBE), etc.

According to the etching process as described above, the sidewalls of the LED 111 according to the disclosure are formed, and the size and the entire shape of the LED 111 are determined.

When etching is performed, the passivation layer 30 is formed on the sidewalls of the LED 111 and a surface on the opposite side of the light-emitting surface of the LED 111 at operation S440.

When the passivation layer 30 is formed, the reflective layer 40 is formed on the passivation layer 30 at operation S450. The passivation layer 30 may be formed by technologies such as atomic layer deposition (ALD), e-beam evaporation, sputtering, and spin coating.

Also, on the passivation layer 30 and the reflective layer 40 as described above, an opening area may be formed. Specifically, an opening area performs a role of making the n-electrode 51 and the p-electrode 52 electronically connected to the n-type semiconductor layer 21 and the p-type semiconductor layer 22. In addition, formation of an opening area may be performed by using photolithography and etching, and the like.

A process of forming the n-electrode 51 and the p-electrode 52 to be electronically connected to the n-type semiconductor layer 21 and the p-type semiconductor layer 22 respectively is performed at operation S460. Specifically, ohmic contact of the n-electrode 51 and the p-electrode 52 to the n-type semiconductor layer 21 and the p-type semiconductor layer 22 may be performed by various technologies such as sputtering, evaporation, and spin coating.

After manufacturing processes as described above are performed, the substrate 80 for growth of semiconductor layers is removed at operation S470. That is, according to the disclosure, a wafer used as a substrate 80 for epitaxial growth of the light-emitting layer 10, the n-type semiconductor layer 21, and the p-type semiconductor layer 22 is removed. Removal of the substrate 80 may be performed by technologies such as laser lift off and wet etching.

When the substrate 80 that exists on the light-emitting surface according to the disclosure is removed, light extraction efficiency can be improved, and also, the efficiency of the process of transferring the manufactured LED 111 to the backplane, i.e., the transferring process can also be improved. Specifically, if the thickness of the LED 111 becomes thinner as the substrate 80 is removed, then the efficiency of a transferring process such as a roll to roll method of picking up the LED 111 by using a cylindrical roll and transferring the LED 111 to a backplane can be improved.

According to the manufacturing method as described above, the LED 111 as illustrated in FIG. 5D may be manufactured. The LED 111 has the same configuration as the LED 111 as illustrated in FIG. 1.

Meanwhile, so far, a manufacturing method of the LED 111 according to an embodiment of the disclosure was illustrated sequentially, but the disclosure is not necessarily limited to the aforementioned order. Accordingly, the temporal order among each step of the aforementioned manufacturing method can be changed.

Also, in the case of a step of depositing or forming a plurality of components, such as a step of forming the n-electrode 51 and the p electrode 52, no time-series elements may exist among each step.

Figure 6:
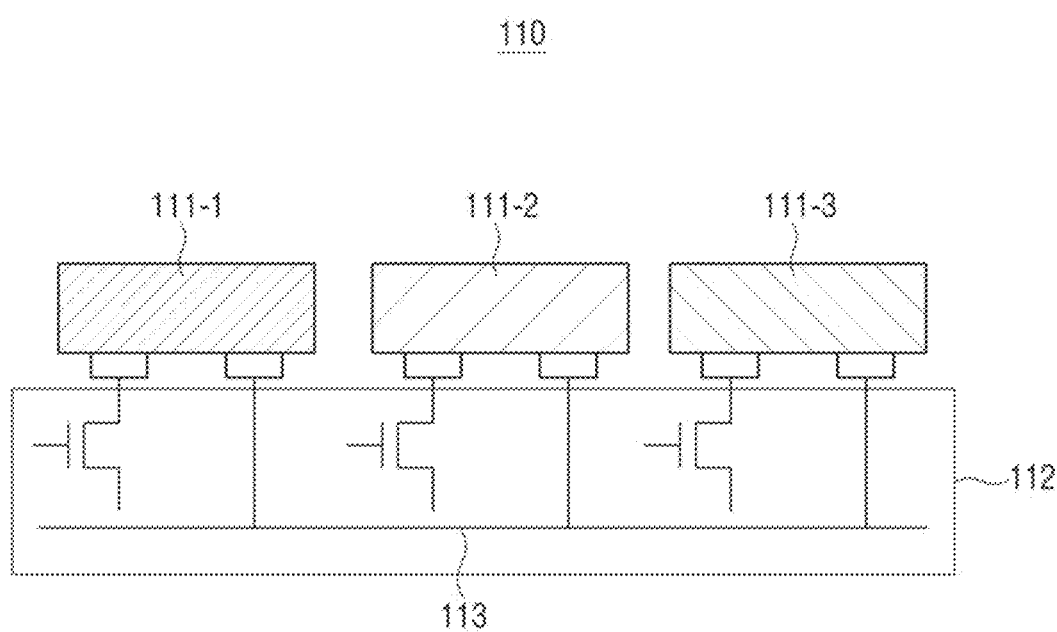
FIG. 6 is a diagram for illustrating a configuration of a display panel included in a display device according to an embodiment.

FIG. 6 is a diagram for illustrating a configuration of a display panel included in a display device according to an embodiment of the disclosure.

The display device according to the disclosure includes a display panel 110 as illustrated in FIG. 6. Also, the display panel 110 includes a plurality of LEDs 111 and a pixel driving circuit 113 for driving the plurality of LEDs 111. Specifically, the plurality of LEDs 111 are connected to the pixel driving circuit 113 included in the backplane 112. In addition, the pixel driving circuit 113 may include a switching element such as a thin film transistor.

Meanwhile, the plurality of LEDs 111 include flip-chip LEDs 111 including a current confinement structure as described above in the explanation regarding FIGS. 1 to 5.

Specifically, the LED 111 included in the display device according to the disclosure includes a light emitting layer 10, an n-type semiconductor layer 21 and a p-type semiconductor layer 22 that are respectively laminated in the upper and lower parts of the light-emitting layer 10, an n-electrode 51 and a p-electrode 52 that are electronically connected to the n-type semiconductor layer 21 and the p-type semiconductor layer 22 respectively, a passivation layer 30 formed on the sidewalls of the LED 111 and a surface on the opposite side of the light-emitting surface of the LED 111, a reflective layer 40 formed on the passivation layer 30 so as to reflect light emitted from the light-emitting layer 10 in the direction of the light-emitting surface, and a resistive area 60 formed in an area surrounding the light emitting layer 10 so as to restrict a current flowing through the light emitting layer 10 from flowing to the sidewalls.

Meanwhile, the display panel 110 according to the disclosure is divided into a plurality of pixels arranged in the form of a matrix. Each of the plurality of pixels includes an R sub pixel including red LEDs 111-1, a G sub pixel including green LEDs 111-2, and a B sub pixel including blue LEDs 111-3. Also, the plurality of pixel driving circuits 113 are formed with respect to each of the R sub pixel, the G sub pixel, and the B sub pixel.

That is, the display device according to the disclosure uses the LED 111 as a light source of self-irradiation type pixels. Also, although not illustrated in FIG. 6, the display panel 110 of the display device according to the disclosure may further include a panel driver (not shown) and a timing controller (not shown).

The timing controller controls the panel driver by transmitting an image data signal or a control signal to the panel driver. Also, the panel driver including a plurality of Driver Integrated Circuits (DICs) controls the driving of the display panel 110. Specifically, the plurality of driver ICs included in the panel driver may control the plurality of pixel driving circuits 113, and may thereby control light emission of the plurality of LEDs 111 connected to each of the plurality of pixel driving circuits 113.

In the case where the LED 111 having high light emitting efficiency as described above is included in a display device, the display device can output images of a high resolution and a high contrast ratio, and the power consumption of the display device can also be reduced.

According to the various embodiments of the disclosure as described above, the light-emitting efficiency of the LED 111 can be improved. Further, in manufacturing a display device, utilization of the LED 111 and efficiency in the manufacturing process can be improved.

First, according to the resistive area 60 according to the disclosure, the sidewalls having defects and the current path are spaced apart from each other, and thus non-radiative recombination on the sidewalls is suppressed. Accordingly, the internal quantum efficiency inside the LED 111 is improved, and consequently, the light-emitting efficiency and stability of light output of the LED 111 are improved.

Also, according to the flip-chip structure according to the disclosure, an electrode is not formed on a surface that emits light. Accordingly, unlike in the case of LEDs of a lateral type or a vertical type, reduction of light extraction efficiency due to a shading effect does not occur. In addition, in the case of a flip-chip LED 111, it has high efficiency in a transferring process, and is also advantageous for miniaturization, weight reduction, and high integration of a single diode. Thus, the LED can particularly be used widely in the field of micro LEDs that is gaining attention recently, etc.

Also, the reflective layer 40 according to the disclosure can reflect light toward the sidewalls of the LED 111 and a surface on the opposite side of the light-emitting surface of the LED 111 in the direction of the light-emitting surface, and accordingly, the light extraction efficiency of the LED 111 can be improved.

Further, according to the disclosure, the substrate 80 that exists on the light emitting surface is removed, and accordingly, light extraction efficiency can be improved, and also, efficiency of a transferring process can be improved.

Meanwhile, in case the LED 111 having high light-emitting efficiency as described above is included in a display device, the display device can output images of a high resolution and a high contrast ratio, and the power consumption of the display device can also be reduced.

So far, preferred embodiments of the disclosure have been shown and described, but the disclosure is not limited to the aforementioned specific embodiments, and it is apparent that various modifications may be made by those having ordinary skill in the art to which the disclosure belongs, without departing from the scope of the disclosure as claimed by the appended claims, and such modifications are not to be interpreted independently from the technical idea or prospect of the disclosure.

What is claimed is:

1. A flip-chip light-emitting diode (LED) comprising:
    a light-emitting layer;
    an n-type semiconductor layer disposed on an upper surface of the light-emitting layer;
    a p-type semiconductor layer disposed on a lower surface of the light-emitting layer;
    an n-electrode directly connected to the n-type semiconductor layer;
    a p-electrode directly connected to the p-type semiconductor layer;
    a passivation layer disposed on sidewalls of the LED and a surface on an opposite side of a light-emitting surface of the LED;
    a reflective layer disposed on the passivation layer, and that reflects light emitted from the light-emitting layer; and
    a resistive area including implanted ions disposed on side surfaces of the light-emitting layer, and that restricts current flow from the light-emitting layer to the sidewalls,
    wherein the n-electrode and the p-electrode are disposed on a first surface opposite to a second surface at which the light-emitting layer emits light to an outside of the LED.

2. The LED of claim 1, wherein the resistive area is disposed on side surfaces of the entire p-type semiconductor layer, on the side surfaces of the entire light-emitting layer, and on side surfaces of a portion of the n-type semiconductor layer.

3. The LED of claim 1, wherein the reflective layer is a metal reflector or distributed-Bragg-reflector structure.

4. The LED of claim 1, further comprising:
    a contact hole that passes through the p-type semiconductor layer and the light-emitting layer, and connects the n-electrode to the n-type semiconductor layer,
    wherein the resistive area surrounds the contact hole and restricts the current flow from the light-emitting layer to the contact hole.

5. The LED of claim 1, wherein the LED has an area less than or equal to 10,000 mm$^2$.

6. The LED of claim 1, wherein the implanted ions include one or more of hydrogen ions, aluminum ions, oxygen ions, nitrogen ions, iron ions, and carbon ions.

7. A manufacturing method of a flip-chip light-emitting diode (LED) comprising:
    depositing an n-type semiconductor layer, a light-emitting layer, and a p-type semiconductor layer on a substrate;
    forming a resistive area on side surfaces of the light-emitting layer;
    etching the n-type semiconductor layer, the light-emitting layer, and the p-type semiconductor layer;
    forming a passivation layer on sidewalls of the LED, and a surface on an opposite side of a light-emitting surface of the LED;
    forming a reflective layer on the passivation layer;
    forming an n-electrode to connect to the n-type semiconductor layer;
    forming a p-electrode to connect to the p-type semiconductor layer; and removing the substrate,
wherein the resistive area is formed on the light-emitting layer, the n-type semiconductor layer, and the p-type semiconductor layer by ion-implantation.

8. The manufacturing method of an LED of claim 7, wherein the resistive area is formed on side surfaces of the entire p-type semiconductor layer, on the side surfaces of the entire light-emitting layer, and on side surfaces of a portion of the n-type semiconductor layer.

9. The manufacturing method of an LED of claim 7, wherein the reflective layer is a metal reflector or distributed-Bragg-reflector structure.

10. The manufacturing method of an LED of claim 7, further comprising:
forming a contact hole that passes through the p-type semiconductor layer and the light-emitting layer to connect the n-electrode to the n-type semiconductor layer,
wherein the resistive area is formed to surround the contact hole, and restricts a current flow from the light-emitting layer to the contact hole.

11. The manufacturing method of an LED of claim 7, wherein the LED has an area less than or equal to 10,000 $mm^2$.

12. The manufacturing method of an LED of claim 7, wherein the resistive area includes implanted ions including one or more of hydrogen ions, aluminum ions, oxygen ions, nitrogen ions, iron ions, and carbon ions.

13. A display device comprising:
a display panel having a plurality of flip-chip light emitting diodes (LEDs) and a plurality of pixel driving circuits for driving the plurality of LEDs, and that is divided into a plurality of pixels arranged in a form of a matrix,
wherein each of the plurality of LEDs respectively comprise:
a light-emitting layer;
an n-type semiconductor layer disposed on an upper surface of the light-emitting layer;
a p-type semiconductor layer disposed on a lower surface of the light-emitting layer;
an n-electrode directly connected to the n-type semiconductor layer;
a p-electrode directly connected to the p-type semiconductor layer;
a passivation layer disposed on sidewalls of the LED and a surface on an opposite side of a light-emitting surface of the LED;
a reflective layer disposed on the passivation layer, and that reflects light emitted from the light-emitting layer; and
a resistive area including implanted ions disposed on side surfaces of the light-emitting layer, and that restricts current flow from the light-emitting layer to the sidewalls,
wherein the n-electrode and the p-electrode are disposed on a first surface opposite to a second surface at which the light-emitting layer emits light to an outside of the LED.

14. The display device of claim 13, wherein:
each of the plurality of pixels comprises an R sub pixel comprising red LEDs, a G sub pixel comprising green LEDs, and a B sub pixel comprising blue LEDs, and
the plurality of pixel driving circuits are formed with respect to each of the R sub pixel, the G sub pixel, and the B sub pixel.

15. The display device of claim 13, wherein the implanted ions include one or more of hydrogen ions, aluminum ions, oxygen ions, nitrogen ions, iron ions, and carbon ions.

* * * * *